(12) United States Patent
Li

(10) Patent No.: US 6,818,500 B2
(45) Date of Patent: Nov. 16, 2004

(54) METHOD OF MAKING A MEMORY CELL CAPACITOR WITH $Ta_2O_5$ DIELECTRIC

(75) Inventor: Weimin Li, Boise, ID (US)

(73) Assignee: Micron Technology, Inc., Boise, ID (US)

(*) Notice: Subject to any disclaimer, the term of this patent is extended or adjusted under 35 U.S.C. 154(b) by 34 days.

(21) Appl. No.: 10/137,424

(22) Filed: May 3, 2002

(65) Prior Publication Data

US 2003/0207528 A1 Nov. 6, 2003

(51) Int. Cl.[7] .......................................... H01L 21/8242
(52) U.S. Cl. ....................... 438/240; 438/253; 438/393; 438/396
(58) Field of Search ................................. 438/239, 240, 438/253, 393, 396, FOR 220, FOR 430

(56) References Cited

U.S. PATENT DOCUMENTS

| | | | | |
|---|---|---|---|---|
| 4,660,277 A | * | 4/1987 | Tei | 438/15 |
| 5,858,832 A | * | 1/1999 | Pan | 438/250 |
| 6,114,222 A | * | 9/2000 | Thakur | 438/471 |
| 6,130,451 A | * | 10/2000 | Hasegawa | 257/310 |
| 6,177,284 B1 | * | 1/2001 | Horii et al. | 438/3 |
| 6,300,653 B1 | * | 10/2001 | Pan | 257/296 |
| 6,495,412 B1 | * | 12/2002 | Zhu et al. | 438/240 |
| 6,514,826 B1 | * | 2/2003 | Park et al. | 438/287 |
| 6,531,372 B2 | * | 3/2003 | Lee et al. | 438/396 |
| 6,544,875 B1 | * | 4/2003 | Wilk | 438/591 |
| 6,548,343 B1 | * | 4/2003 | Summerfelt et al. | 438/240 |
| 6,580,111 B2 | * | 6/2003 | Kim et al. | 257/301 |
| 6,599,807 B2 | * | 7/2003 | Lim et al. | 438/396 |
| 6,600,183 B1 | * | 7/2003 | Visokay et al. | 257/295 |
| 6,620,673 B1 | * | 9/2003 | LaFleur | 438/240 |
| 2001/0041413 A1 | * | 11/2001 | Adachi | 438/382 |
| 2001/0042878 A1 | * | 11/2001 | Shin | 257/296 |

OTHER PUBLICATIONS

Nobuzo Terao, Jpn. J. of Appl. Phys., vol. 6, No. 1, (1967) 21 ###.
Chang Hwan Chun, et al., Mat. Res. Soc. Symp. Proc., vol. 230, (1992) 357.
S.W. Park, et al., J. of Electronic Mat., vol. 21, No. 6, (1992) 635.
Satoshi Kamiyama, et al., J. Electrochem, Soc., vol. 140, No. 6. (1993) 1617.
II Kim, et al., Jpn. J. Appl. Phys., vol. 33 (1994) 6691.
II Kim, et al., J. Electronic Mat., vol. 24, No. 10, (1995) 1435.
Tomonori Aoyama, et al., J. Electrochem. Soc., vol. 143, No. 3, (1996) 977.
C. Chaneliere, et al., Mat. Sci. Eng., R22 (1998) 269.
Santhiagu Ezhilvalavan, et al., J. Am. Ceram. Soc., vol. 82, No. 3, (1999) 600.
R. Furukawa, et al., IEEE ISSM Proceeding 1999 249.
P.C. Johsi, et al., J. Appl. Phys., vol. 86, No. 2 (1999) 871.
Yong–Bae Park, et al., J. Mat. in Electronics, vol. 10, (1999) 113.
Chich Shang Chang, et al., Jpn. J. Appl. Phys., vol. 38 (1999) 6812.
Jong–Wan Park, et al., Mat. Res. Soc. Symp. Proc. vol. 353. (1995) 483.

* cited by examiner

Primary Examiner—George Fourson
Assistant Examiner—Joannie Adelle Garcia
(74) Attorney, Agent, or Firm—Dickstein Shapiro Morin & Oshinsky LLP

(57) ABSTRACT

The present invention provides a method for making an integrated circuit capacitor having a $Ta_2O_5$ dielectric which includes a high-temperature nitrogen anneal and a low-temperature ozone anneal of the dielectric.

39 Claims, 10 Drawing Sheets

METHOD OF MAKING A MEMORY CELL CAPACITOR WITH $Ta_2O_5$ DIELECTRIC

BACKGROUND OF THE INVENTION

1. Field of the Invention

The present invention relates to the field of semiconductors, and more particularly to a method for making a capacitor in an integrated circuit.

2. Description of the Related Art

A memory cell in an integrated circuit, such as a dynamic random access memory (DRAM) array, typically comprises a charge storage capacitor (or cell capacitor) coupled to an access device such as a Metal Oxide Semiconductor Field Effect Transistor (MOSFET). The MOSFET functions to apply or remove charge on the capacitor, thus effecting a logical state defined by the stored charge. The amount of charge stored on the capacitor is proportional to the capacitance C, defined by $C=kk_0 A/d$, where k is the relative dielectric constant of the capacitor dielectric, $k_0$ is the vacuum permittivity, A is the electrode surface area and d is the distance between electrodes.

As integrated circuits are continually scaled down and achieve ever higher levels of integration, the area available for memory cells is being reduced. Nevertheless, each capacitor is still required to maintain a minimum capacitance. It is therefore important that capacitors achieve a high stored charge per footprint or unit of chip area occupied. However, the use of silicon nitride ($Si_3N_4$) as the dielectric in DRAM capacitors is reaching some fundamental limitations as DRAM cells are scaled down. For example, as the $Si_3N_4$ film is continually made thinner, leakage current arising from electron tunneling through the dielectric increases. A thicker $Si_3N_4$ film is of course unacceptable since a higher distance between electrodes results in lower capacitance and a lowering of the charge able to be stored in the capacitor. Before long, such a limitation will present a barrier to the development of future generations of DRAM cells.

Several techniques have been considered for increasing the total charge capacity of the DRAM cell capacitor without significantly affecting the chip area occupied by the cell. Perhaps the most promising solution is the use of new capacitor dielectrics with higher dielectric constant k values. The decrease in capacitance that would occur were a thicker $Si_3N_4$ film to be used is offset by a higher k value. That is, the higher dielectric constant allows a thicker film to be deposited than would be practicable with $Si_3N_4$, while reducing leakage current and providing a level of capacitance that would be unattainable with $Si_3N_4$ films. One promising dielectric candidate is tantalum pentoxide ($Ta_2O_5$), which is characterized by an effective dielectric constant significantly higher than conventional dielectrics such as $Si_3N_4$. Whereas k=9 for silicon nitride, $Ta_2O_5$ has a dielectric constant of about 25. Therefore, using $Ta_2O_5$ enables the creation of much smaller and simpler capacitor structures for a given stored charge requirement.

However, difficulties have been encountered in incorporating $Ta_2O_5$ into conventional fabrication flows. For example, after $Ta_2O_5$ is deposited on a capacitor electrode, it must be annealed at a high temperature in the presence of a highly oxidizing plasma or ambient. The high temperature converts the amorphous $Ta_2O_5$ to crystalline $Ta_2O_5$, which is preferred to achieve a higher dielectric constant. The highly oxidizing plasma or ambient reduces leakage current by ensuring maintenance of the appropriate oxygen content in the dielectric. However, the oxygen diffuses through the $Ta_2O_5$ layer and oxidizes elements of the integrated circuit including the bottom electrode of the capacitor, for example, a metal electrode, a diffusion barrier, and an underlying polycrystalline silicon (polysilicon) plug. This oxidization negates the advantages realized by utilizing $Ta_2O_5$ over $Si_3N_4$ as the capacitor dielectric in the first place. For example, oxygen diffusing through the bottom electrode oxidizes the polysilicon plug. This creates a layer of insulating $SiO_2$ at the surface of the polysilicon plug which significantly increases resistance at the capacitor to plug interface. One solution is to employ a conductive oxygen barrier to halt the diffusion of the oxidant to structures in the capacitor and integrated circuit. This, however, has proven very difficult and costly to achieve.

Thus, there is a need for an improved method for making a DRAM cell capacitor with a crystalline $Ta_2O_5$ dielectric exhibiting low leakage while at the same time possessing a crystalline structure which provides high capacitance.

SUMMARY

The present invention provides a method for making a DRAM cell capacitor that utilizes crystalline $Ta_2O_5$ having low leakage characteristics as the dielectric while mitigating oxidation problems. A diffusion barrier layer formed of tantalum nitride (TaN), titanium nitride (TiN), or tantalum silicon nitride (TaSiN) is formed on top of the polysilicon plug, and a bottom capacitor electrode formed from platinum, rhodium, or a platinum-rhodium alloy is formed on the diffusion barrier layer. $Ta_2O_5$ is deposited on the bottom electrode and is then annealed at least two times. One of the anneals is a high-temperature anneal in a nitrogen ($N_2$) ambient which crystallizes $Ta_2O_5$ in an orientation that provides a high dielectric constant. Another anneal is accomplished at low temperature in an ozone ($O_3$) ambient, achieving a reduction in leakage current. After the anneals are completed, an upper electrode of platinum, rhodium, or platinum-rhodium alloy is deposited on top of the crystalline $Ta_2O_5$.

Additional advantages and features of the present invention will be apparent from the following detailed description provided in connection with the accompanying drawings which illustrate exemplary embodiments of the invention.

DETAILED DESCRIPTION

In the following description, reference is made to the accompanying drawings which will serve to illustrate exemplary embodiments of the invention. The description provides sufficient detail to enable those skilled in the art to practice the invention. Of course other embodiments may be used and various changes may be made without departing from the scope of the present invention. The scope of this invention is defined by the appended claims.

Figure 1:
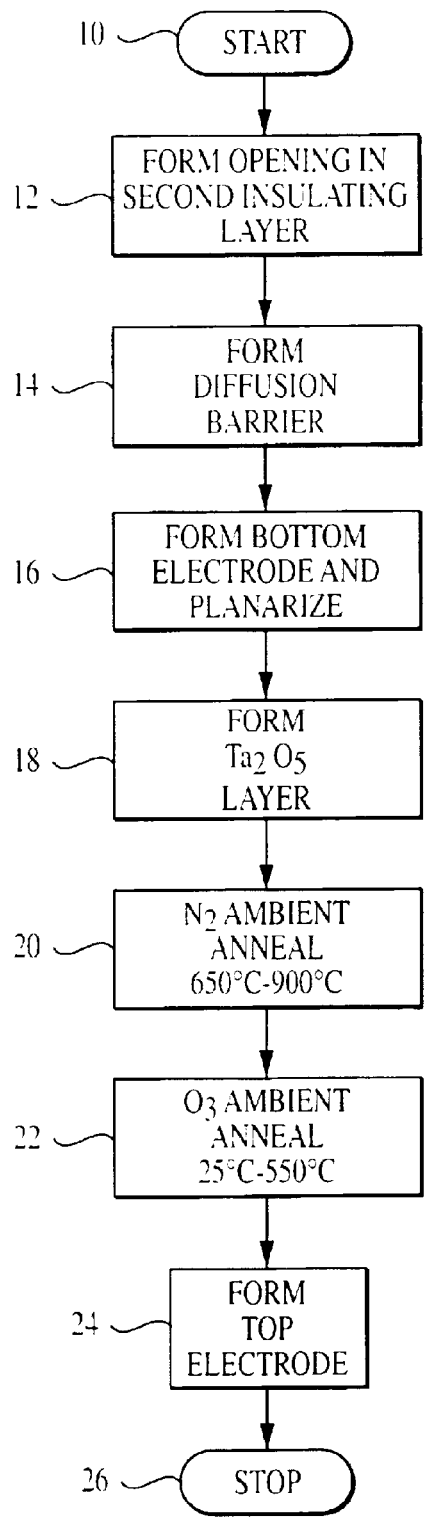
FIG. 1 is a flowchart for the method for making DRAM cell capacitor in accordance with the present invention.

Referring now to the drawings, one embodiment of a method for making a DRAM cell capacitor is represented in FIG. 1. The DRAM capacitor is made according to a process which begins with the structure of FIG. 2. The capacitor manufacture begins after the formation of most of the elements of the memory cell, including a word line gate 32 formed over a gate oxide 31 and source/drain areas 34 and 36 which together form an access transistor 38 on the semiconductor substrate 30.

Following the fabrication of the transistor 38, an insulating layer 40, made of a material such as borophosphosilicate glass (BPSG) is formed over the semiconductor substrate 30 as well as the transistor 38. An conductive plug 42 made from an oxidizable material such as polysilicon is formed in insulating layer 40 and provides a conductive contact with active area 34. A second insulating layer 44 is formed over the first insulating layer 40 and an opening 72 is provided therein over the plug 42 for construction of a capacitor. Insulating layer 44, like insulating layer 40, may be formed of BPSG.

Figure 2:
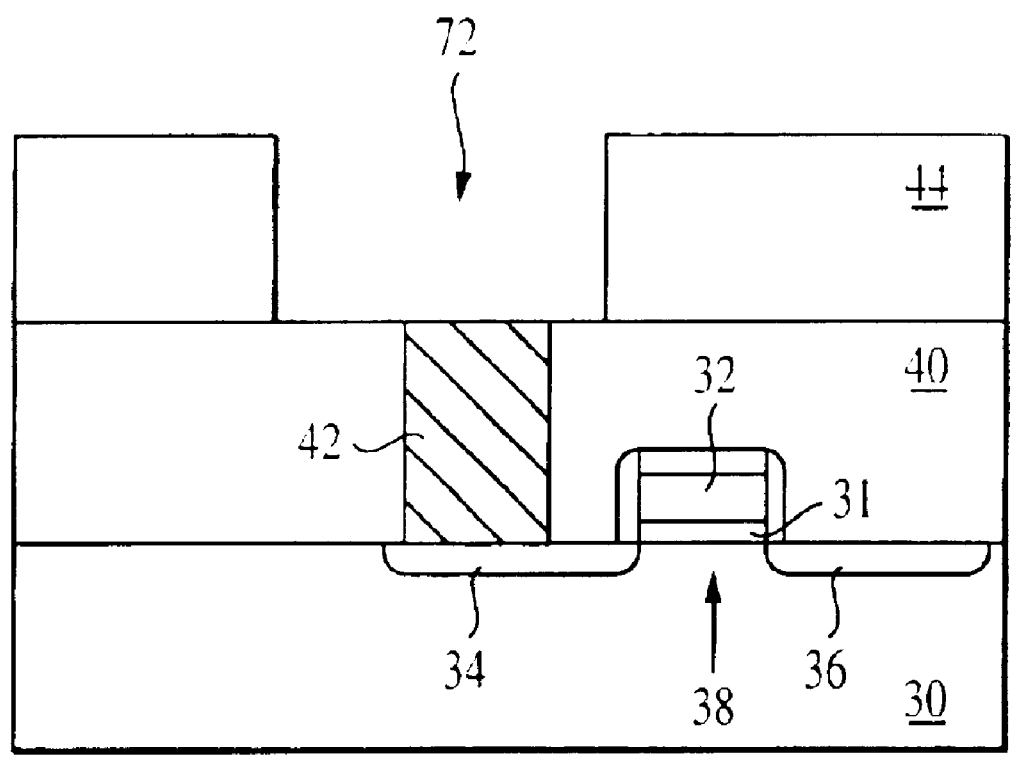
FIG. 2 is a cross-sectional view of a semiconductor substrate having transistors and an insulating layer formed thereon.

The capacitor that is the subject of this invention is formed in opening 72. Referring to FIG. 1 and FIG. 2, the method of the invention begins with the formation of opening 72 in insulating layer 44, depicted in FIG. 1 as processing step 12.

Figure 3:
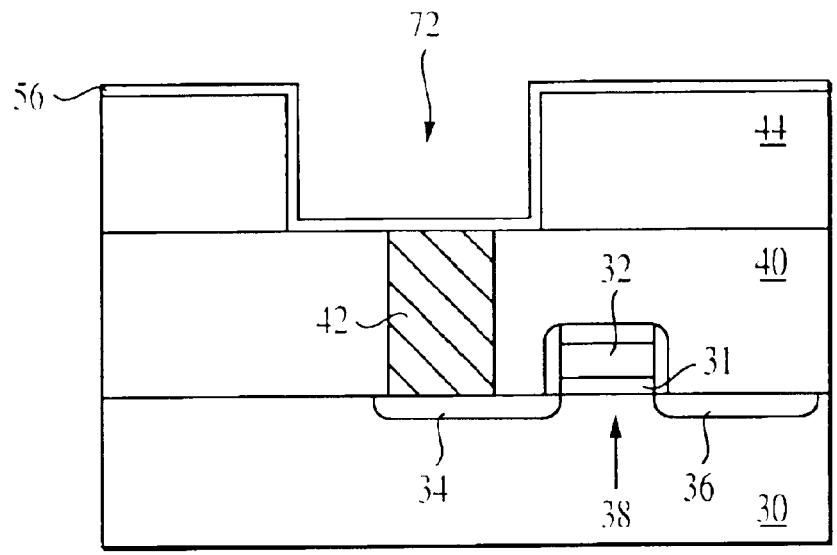
FIG. 3 shows the substrate of FIG. 2 undergoing the process of the preferred embodiment of the present invention.

Referring now to FIG. 1 and FIG. 3, the next step in making the capacitor is to form a diffusion barrier layer 56 in opening 72, as shown as processing step 14 in FIG. 1. The diffusion barrier layer 56 prevents diffusion between a metal bottom electrode of a capacitor and the polysilicon conductive plug 42. The diffusion barrier layer 56 may be any material known in the art which is conductive and which prevents diffusion of materials between the oxidizable conductive plug 42 and the bottom electrode. Preferable materials for the diffusion barrier 56 layer include tantalum nitride (TaN), tantalum silicon nitride (TaSiN), or titanium nitride (TiN). The diffusion barrier layer 56 can be applied using chemical vapor deposition (CVD), physical vapor deposition (PVD), or other conventional methods known in the art.

Figure 4:
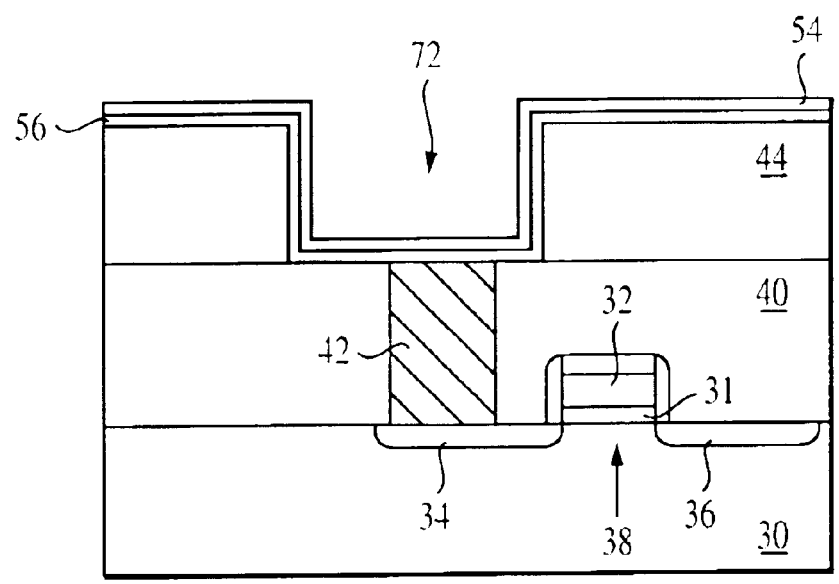
FIG. 4 shows the substrate of FIG. 3 at a processing step subsequent to that shown in FIG. 3.
Figure 5:
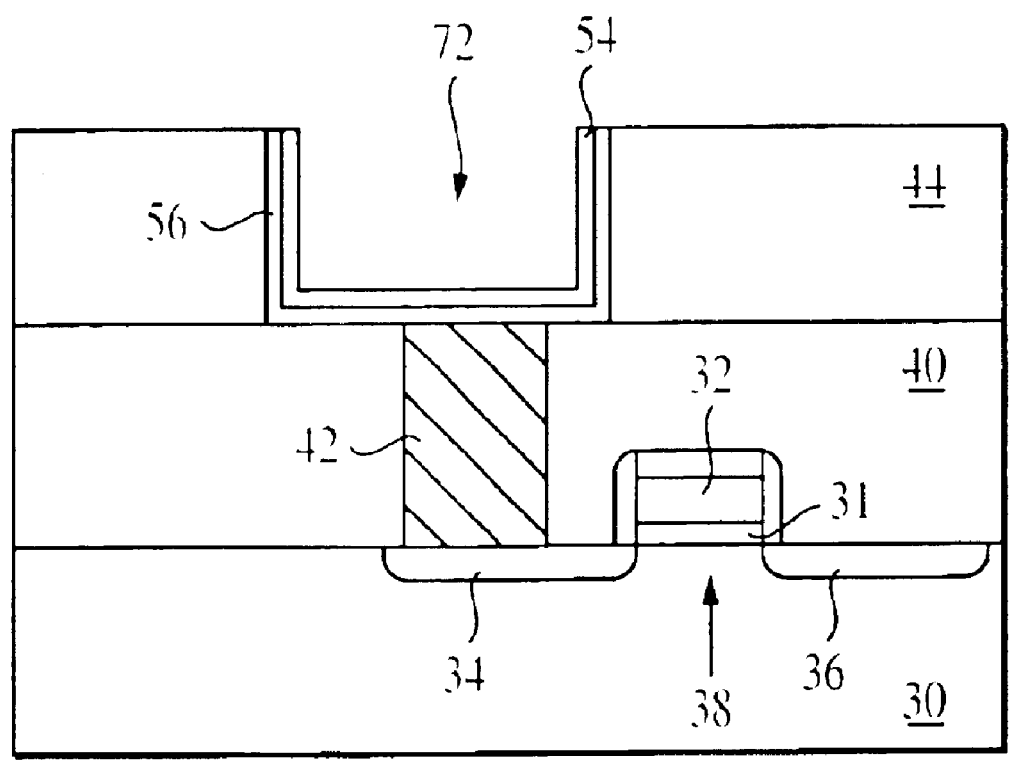
FIG. 5 shows the substrate of FIG. 4 at a processing step subsequent to that shown in FIG. 4.

FIG. 1 and FIG. 4 depict the next step 16 of the process, which is the formation of a bottom electrode 54 in the opening 72, adjacent to the diffusion barrier layer 56. The bottom electrode 54 may be made from platinum, rhodium, or a platinum-rhodium alloy, and is preferably formed by CVD, although it can readily be formed by PVD or other techniques known in the art. Referring now to FIG. 5, the diffusion barrier layer 56 and the bottom electrode layer 54 are planarized as known in the art, e.g., by chemical mechanical planarization (CMP), so that diffusion barrier layer 56 and the bottom electrode 54 are present in opening 72, but not on the uppermost surface of the second insulating layer 44.

Figure 6:
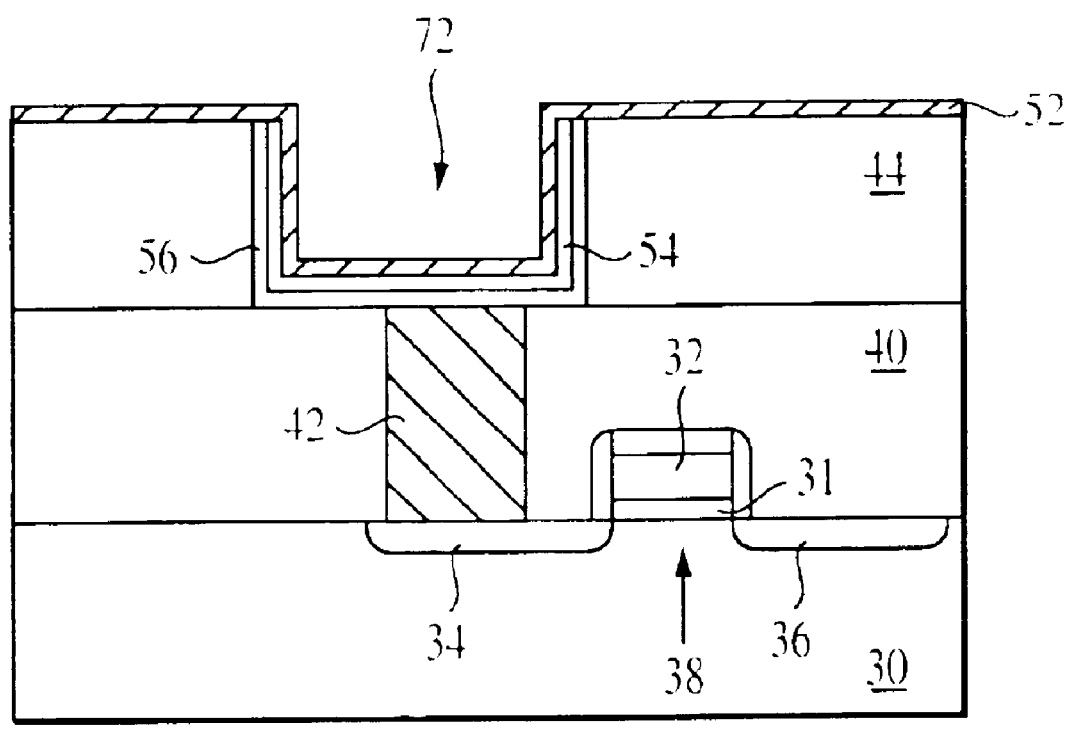
FIG. 6 shows the substrate of FIG. 5 at a processing step subsequent to that shown in FIG. 5.

Referring to FIG. 1 and FIG. 6, the next step 18 is the formation of a tantalum pentoxide ($Ta_2O_5$) dielectric layer 52 on the bottom electrode 54, while maintaining a temperature less than 650° C. in order to prevent oxygen in the ambient from oxidizing the bottom electrode, diffusion barrier, and polysilicon plug. The $Ta_2O_5$ layer 52 may be formed on the bottom electrode 54 by CVD or other techniques known in the art. Further, the thickness of the $Ta_2O_5$ layer 52 in the present embodiment is about 50 to about 150 Angstroms, with about 100 Angstroms preferred. Of course, the thickness may vary with the particular application, as is known in the prior art.

After the $Ta_2O_5$ layer 52 is formed on the bottom electrode, it is twice annealed as depicted in FIG. 1, step 20 and step 22. The $Ta_2O_5$ layer 52 is first annealed at step 20 in a nitrogen ($N_2$) ambient while a temperature of about 650° C. to about 900° C. is maintained. This anneal crystallizes the amorphous $Ta_2O_5$ layer 52. The $N_2$ anneal is followed by annealing the $Ta_2O_5$ layer 52 in an ozone ($O_3$) ambient while a temperature of about 25° C. to about 550° C. is maintained, as shown in step 22.

In another embodiment of the present invention, the $Ta_2O_5$ layer 52 is annealed first in an ozone ambient at a temperature of about 25° C. to about 550° C. as shown in step 22, followed by an $N_2$ anneal at a temperature of about 650° C. to about 900° C., as shown in step 20. In either embodiment, little oxidation of DRAM cell components such as polysilicon plug 42 occurs in the annealing process because of the relatively low temperature used in the ozone anneal step 22.

In both these embodiments, the temperature maintained during the ozone anneal is about 550° C. or less. Performing an anneal with an oxygen-containing (and thus highly oxidizing) ambient at a relatively low temperature mitigates oxidation of the polysilicon plug and other parts of the memory cell. The acceptable amount of oxidation allowable in a memory capacitor utilizing a $Ta_2O_5$ dielectric can be expressed in terms of resistance of the polysilicon plug. An anneal in the presence of an oxygen containing ambient that results in a post-anneal polysilicon plug resistance of not more than about 50% greater than pre-anneal polysilicon plug resistance represents an acceptably low level of oxidation occurring during the anneal sequence, meaning that a memory cell capacitor with a $Ta_2O_5$ dielectric that is subject to this level of resistance or less will display less leakage than capacitors annealed in nitrogen only.

Figure 7:
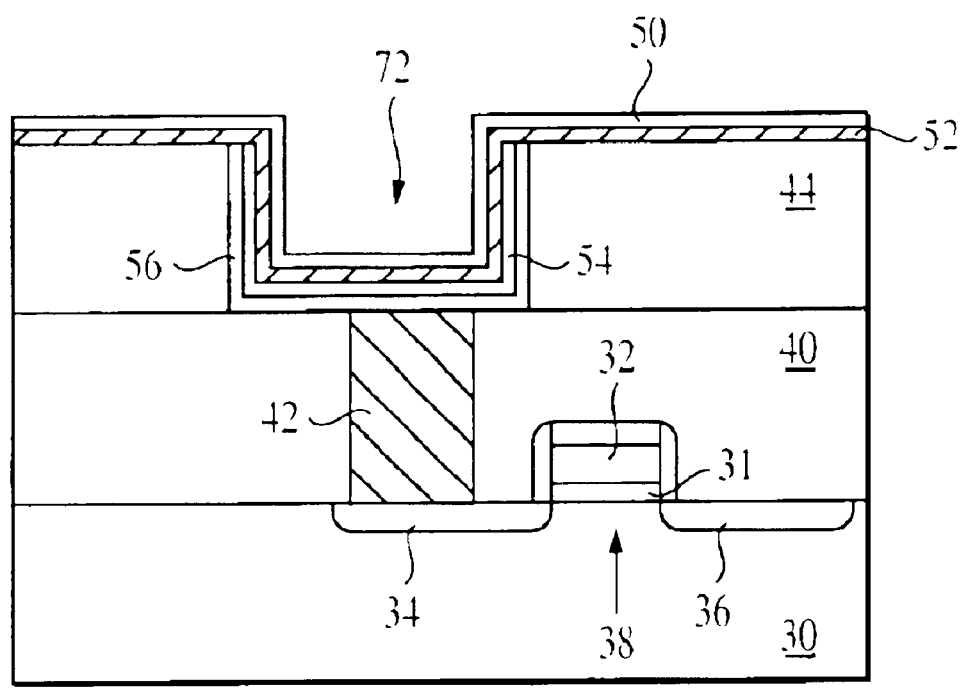
FIG. 7 shows the substrate of FIG. 6 at a processing step subsequent to that shown in FIG. 5.

As shown in FIG. 7, and depicted as step 24 in FIG. 1, after either detailed embodiment of the two-stage annealing process, an upper electrode 50 is formed over the crystalline $Ta_2O_5$ layer 52. The upper electrode 50 may be platinum, rhodium, or a platinum-rhodium alloy, with platinum preferred. As with the other films, the upper electrode can be formed in many ways known in the art, such as by CVD or PVD. The capacitor structure as shown in FIG. 6 is complete. Further steps known in the art may now be taken to complete the memory cell.

Figure 8:
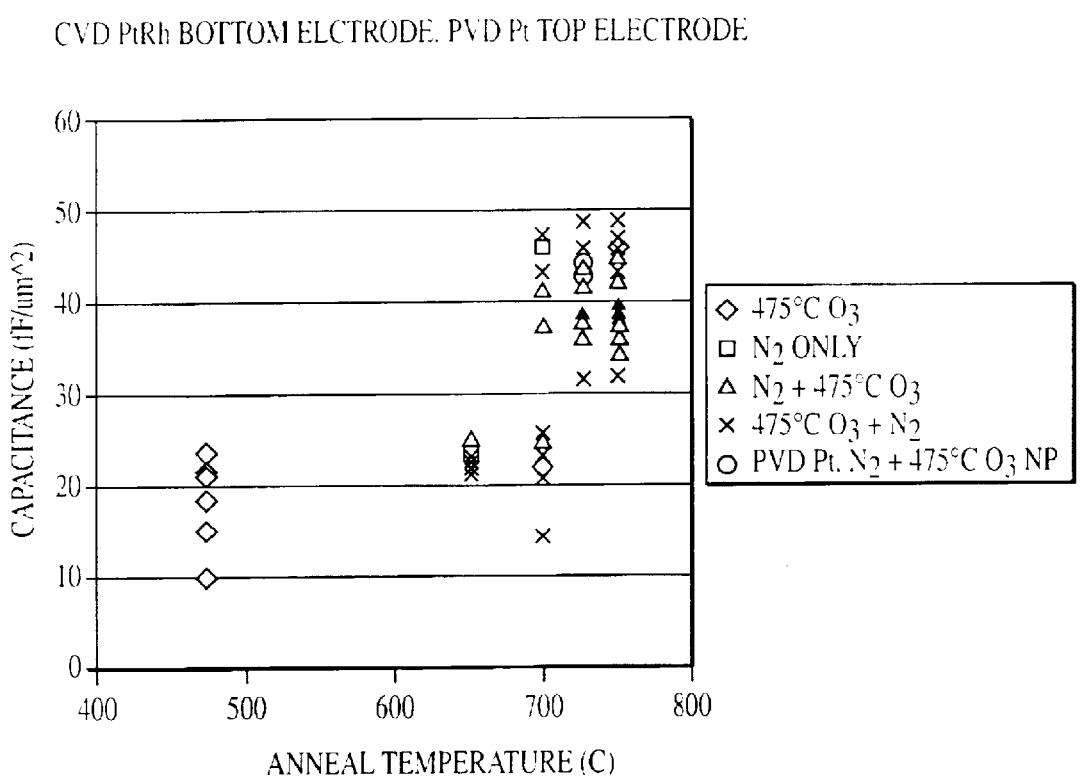
FIG. 8 shows experimental data which compare the capacitance of a DRAM capacitor made according to the present method with capacitors made according to other methods.
Figure 9:
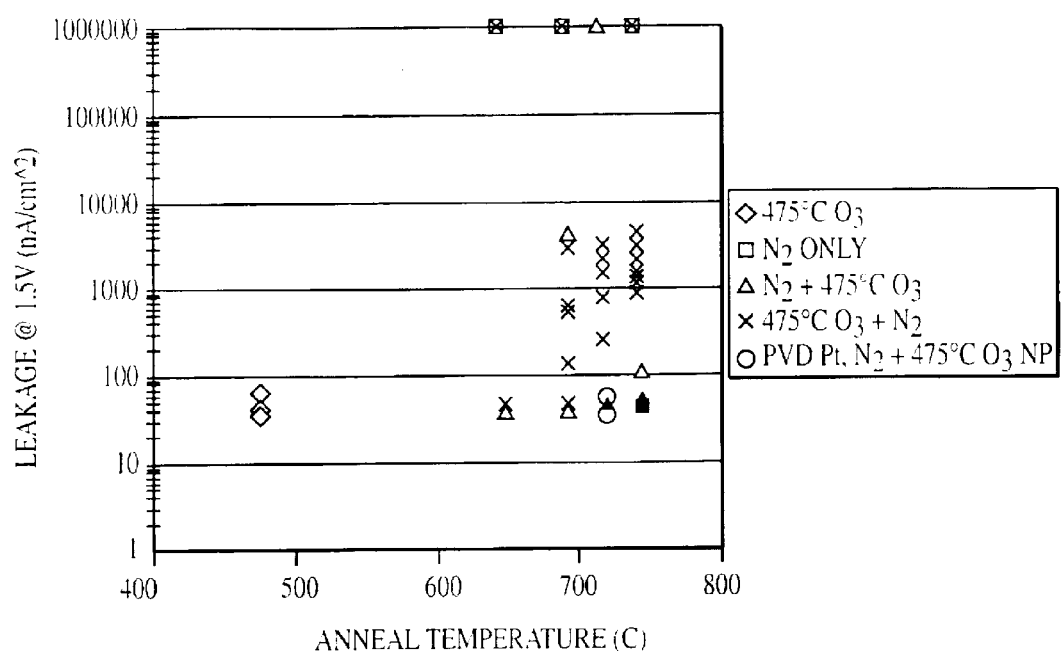
FIG. 9 shows experimental data which compare the leakage of a DRAM capacitor made according to the present method with capacitors made according to other methods.

Referring now to FIG. 8 and FIG. 9, the improved performance of memory cell capacitors produced in accordance with the present invention becomes obvious. FIG. 8 shows experimental data obtained on the capacitance of memory capacitors manufactured according to five different anneals of a $Ta_2O_5$ dielectric. FIG. 9 shows experimental data obtained on the leakage current of memory capacitors manufactured according to five different anneal sequences of a $Ta_2O_5$ dielectric. The first and second anneal sequences are an ozone only anneal at 475° C. (represented in FIG. 8 and FIG. 9 by a diamond) and a nitrogen only anneal performed at four different temperatures (represented in FIG. 8 and FIG. 9 by a square), both with PtRh bottom electrodes deposited by CVD, $Ta_2O_5$ layer thickness of about 100 Angstroms, and a Pt upper electrode deposited by PVD after the anneal.

The anneal sequence represented by a triangle in FIG. 8 and FIG. 9 is the first of three anneals performed according to the present invention. It includes an $N_2$ anneal performed at one of four different temperatures of about 650° C. or higher, followed by an $O_3$ anneal at about 475° C. This anneal sequence was applied to a 100 Angstrom layer of $Ta_2O_5$ formed on a PtRh bottom electrode deposited by CVD, and covered by a Pt upper electrode deposited by PVD subsequent to the anneals.

The second anneal sequence performed according to the present invention (represented in FIG. 8 and FIG. 9 by an X) is an $O_3$ anneal at about 475° C. followed by an $N_2$ anneal at one of four different temperatures of about 650° C. or higher. This sequence was also applied to a 100 Angstrom layer of $Ta_2O_5$ formed on a PtRh bottom electrode deposited by CVD, and covered by a Pt upper electrode deposited by PVD subsequent to the anneals.

The third anneal sequence performed according to the present invention (represented in FIG. 8 and FIG. 9 by a circle) is an $N_2$ anneal performed at one of four different temperatures of about 650° C. or higher, followed by an $O_3$ anneal at about 475° C. This sequence was applied to an 80 Angstrom layer of $Ta_2O_5$ formed on a Pt bottom electrode deposited by PVD, and covered by a Pt upper electrode deposited by PVD subsequent to the anneals.

FIG. 8 shows that the nitrogen anneal as well as the three anneal sequences of the present invention provide a high capacitance ranging from 20 to 50 femtoFarads/$\mu m^2$ at all nitrogen anneal temperatures tested. In contrast, the 475° C. ozone only anneal resulted in a much lower capacitance ranging from about 10 to 25 femtoFarads/$\mu m^2$. Similarly, FIG. 9 shows experimental data showing that the three anneal sequences performed in accordance with the present invention as well the 475° C. ozone only anneal resulted in capacitors that display less leakage than capacitors annealed in nitrogen only. Capacitors fabricated utilizing anneal sequences performed according to the present invention provided both high capacitance and low leakage, as compared to capacitors fabricated utilizing ozone and nitrogen only anneals, neither of which provided both high capacitance and low leakage.

Figure 10:
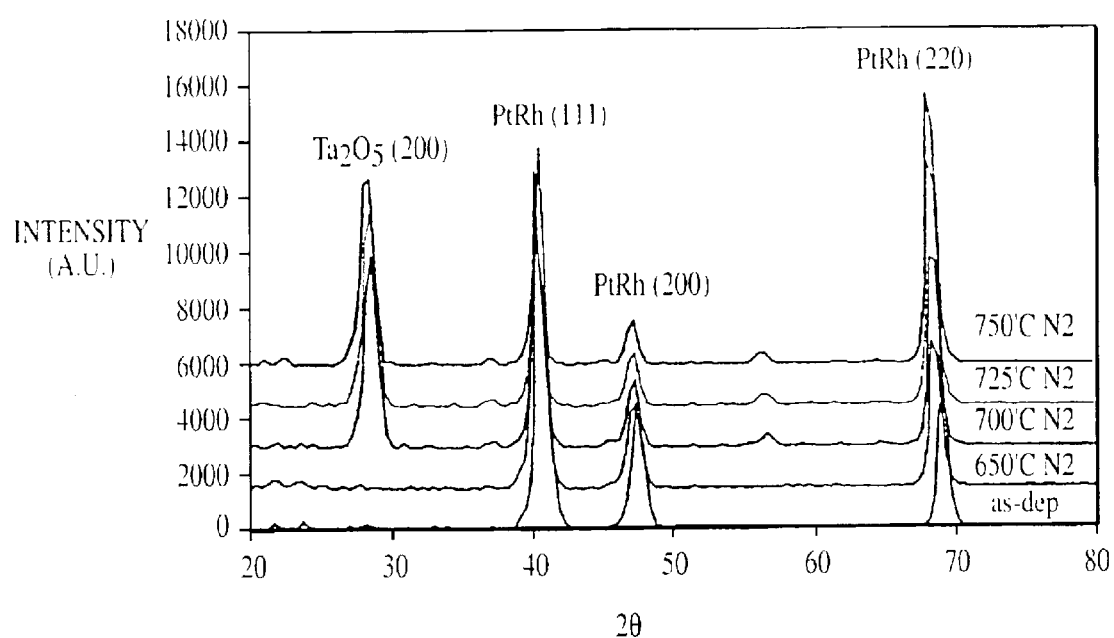
FIG. 10 shows experimental data which indicate the direction of crystal orientation of $Ta_2O_5$ after performing first anneal sequence of present invention.
Figure 11:
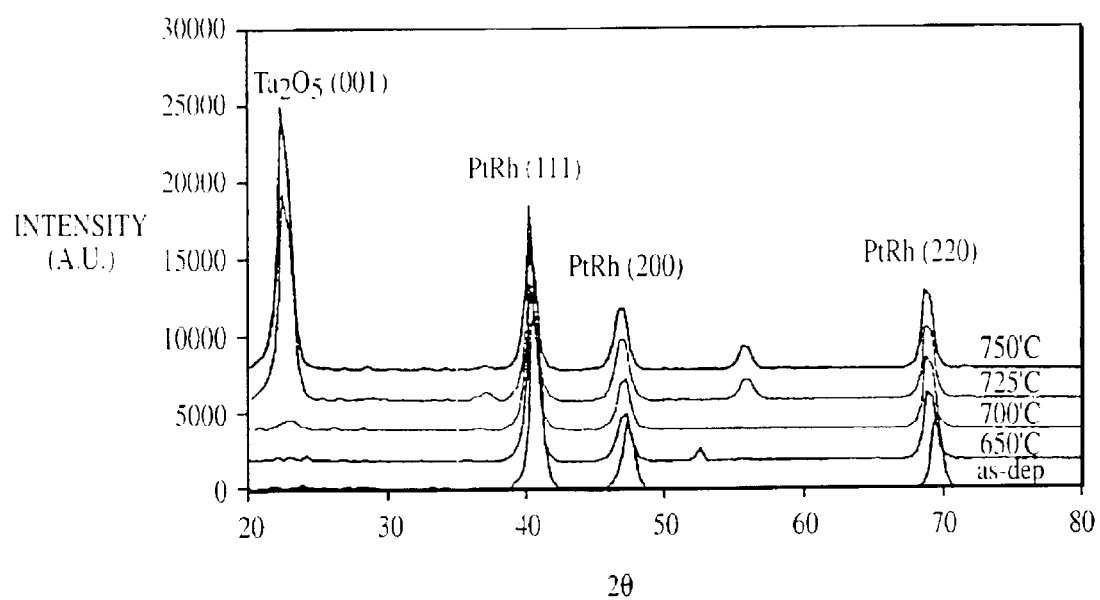
FIG. 11 shows experimental data which indicate the direction of crystal orientation of $Ta_2O_5$ after performing second anneal sequence of present invention.

Referring now to FIG. 10 and FIG. 11, it further becomes clear that each anneal sequence performed according to the present invention also results in a specific crystal growth. FIG. 10 shows data from X-ray diffractometer analysis of the crystalline $Ta_2O_5$ after the anneal sequence of the first embodiment, where the $N_2$ anneal was performed before the $O_3$ anneal. FIG. 10 shows that the resulting crystalline $Ta_2O_5$ has a crystal orientation that is primarily in the <200> direction.

FIG. 11 shows data from X-ray diffractometer analysis of the crystalline $Ta_2O_5$ after the anneal sequence of the second embodiment described above, where steps 20 and 22 are reversed and the $Ta_2O_5$ layer 52 is first annealed in the $O_3$ ambient, followed by the $N_2$ anneal. FIG. 11 shows that the resulting crystalline $Ta_2O_5$ has a crystal orientation that is primarily in the <001> direction.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed is:

1. A method for making an integrated circuit capacitor comprising:

forming a bottom electrode over a substrate;

forming a tantalum pentoxide layer over said bottom electrode;

annealing said tantalum pentoxide layer in an nitrogen atmosphere in a first annealing step;

annealing said tantalum pentoxide layer in an ozone atmosphere in a second annealing step; and forming an upper electrode over said tantalum pentoxide layer; wherein an oxidizable material is provided over said substrate, said ozone atmosphere anneal being performed at a temperature which does not increase the resistance of said oxidizable material by more than about 50% over its initial resistance.

2. A method of claim 1 wherein said first annealing step in a nitrogen atmosphere precedes said second annealing step in an ozone atmosphere.

3. A method of claim 1 wherein said second annealing step in an ozone atmosphere precedes said first annealing step in a nitrogen atmosphere.

4. A method of claim 1 further comprising forming a diffusion barrier between said oxidizable material and said bottom electrode.

5. A method of claim 4 wherein said diffusion barrier comprises tantalum nitride.

6. A method of claim 4 wherein said diffusion barrier comprises tantalum silicon nitride.

7. A method of claim 4 wherein said diffusion barrier comprises titanium nitride.

8. A method of claim 1 wherein said bottom electrode is formed by chemical vapor deposition.

9. A method of claim 1 wherein said bottom electrode comprises platinum.

10. A method of claim 1 wherein said bottom electrode comprises rhodium.

11. A method of claim 1 wherein said bottom electrode comprises a platinum-rhodium alloy.

12. A method of claim 1 wherein said tantalum pentoxide layer is formed by chemical vapor deposition.

13. A method of claim 1 wherein said tantalum pentoxide layer has a thickness of about 50 to about 150 Angstroms.

14. A method of claim 13 wherein said tantalum pentoxide layer has a thickness of about 100 Angstroms.

15. A method of claim 1 wherein said upper electrode is formed by physical vapor deposition.

16. A method of claim 1 wherein said upper electrode comprises platinum.

17. A method of claim 1 wherein said upper electrode comprises rhodium.

18. A method of claim 1 wherein said upper electrode comprises a platinum-rhodium alloy.

19. A method of forming an integrated circuit comprising:

forming an insulating layer over a semiconductor substrate;

forming an oxidizable conductive plug in said insulating layer;

forming a second insulating layer over said oxidizable conductive plug and said insulating layer;

forming an opening in said second insulating layer, said opening being over said oxidizable conductive plug;

forming a diffusion barrier layer in said opening and over said oxidizable conductive plug;

forming a bottom electrode over said diffusion barrier layer;

forming a tantalum pentoxide layer over said bottom electrode;

annealing said tantalum pentoxide layer in a nitrogen atmosphere in a first annealing step;

annealing said tantalum pentoxide layer in an ozone atmosphere in a second annealing step; and forming an upper electrode over said tantalum pentoxide layer.

20. A method of claim 19 wherein said ozone atmosphere anneal is performed at a temperature which does not increase the resistance of said oxidizable conductive plug by more than about 50% over its initial resistance.

21. A method of claim 19 wherein said insulating layer comprises borophosphosilicate glass.

22. A method of claim 19 wherein said oxidizable conductive plug comprises polycrystalline silicon.

23. A method of claim 19 wherein said second insulating layer comprises borophosphosilicate glass.

24. A method of claim 19 wherein said diffusion barrier comprises tantalum nitride.

25. A method of claim 19 wherein said diffusion barrier comprises tantalum silicon nitride.

26. A method of claim 19 wherein said diffusion barrier comprises titanium nitride.

27. A method of claim 19 wherein said bottom electrode comprises platinum.

28. A method of claim 19 wherein said bottom electrode comprises rhodium.

29. A method of claim 19 wherein said bottom electrode comprises a platinum-rhodium alloy.

30. A method of claim 19 wherein said tantalum pentoxide layer is formed by chemical vapor deposition.

31. A method of claim 19 wherein said tantalum pentoxide layer has a thickness of about 50 to about 150 Angstroms.

32. A method of claim 31 wherein said tantalum pentoxide layer has a thickness of about 100 Angatroms.

33. A method of claim 19 wherein said upper electrode is formed by physical vapor deposition.

34. A method of claim 19 wherein said upper electrode comprises a platinum layer.

35. A method of claim 34 wherein said platinum layer is formed by chemical vapor deposition.

36. A method of claim 19 wherein said upper electrode comprises a rhodium layer.

37. A method of claim 36 wherein said rhodium layer is formed by chemical vapor deposition.

38. A method of claim 19 wherein said upper electrode comprises a platinum-rhodium alloy layer.

39. A method of claim 38 wherein said platinum-rhodium alloy layer is formed by chemical vapor deposition.

* * * * *

UNITED STATES PATENT AND TRADEMARK OFFICE
CERTIFICATE OF CORRECTION

PATENT NO. : 6,818,500 B2
DATED : November 16, 2004
INVENTOR(S) : Weimin Li

It is certified that error appears in the above-identified patent and that said Letters Patent is hereby corrected as shown below:

Column 6,
Line 21, "an" should read -- a --; and

Column 8,
Line 17, "Angatroms." should read -- Angstroms. --.

Signed and Sealed this

Seventeenth Day of January, 2006

JON W. DUDAS
*Director of the United States Patent and Trademark Office*